(12) United States Patent
Doherty et al.

(10) Patent No.: US 8,824,983 B2
(45) Date of Patent: *Sep. 2, 2014

(54) SYSTEM AND METHOD OF PREBIAS FOR RAPID POWER AMPLIFIER RESPONSE CORRECTION

(75) Inventors: Mark M. Doherty, Westford, MA (US); Lui Lam, Winchester, MA (US); Chun-Wen Paul Huang, Methuen, MA (US); Anthony Francis Quaglietta, Methuen, MA (US)

(73) Assignee: SiGe Semiconductor, Inc., Ottawa, ON (CA)

( * ) Notice: Subject to any disclaimer, the term of this patent is extended or adjusted under 35 U.S.C. 154(b) by 177 days.

This patent is subject to a terminal disclaimer.

(21) Appl. No.: 13/536,009

(22) Filed: Jun. 28, 2012

(65) Prior Publication Data

US 2013/0034144 A1 Feb. 7, 2013

Related U.S. Application Data

(63) Continuation of application No. 12/629,168, filed on Dec. 2, 2009, now Pat. No. 8,260,224.

(51) Int. Cl.
*H04B 1/04* (2006.01)
*H03F 3/21* (2006.01)
*H03F 1/30* (2006.01)
*H03F 3/24* (2006.01)
*H03G 3/30* (2006.01)

(52) U.S. Cl.
CPC ........ *H03G 3/3047* (2013.01); *H03F 2200/447* (2013.01); *H03F 3/211* (2013.01); *H03F 2200/408* (2013.01); *H03F 2200/18* (2013.01); *H03F 1/302* (2013.01); *H03F 3/245* (2013.01)
USPC .................. 455/127.1; 455/127.2; 455/127.3; 455/232.1

(58) Field of Classification Search
USPC ..................... 455/127.1, 127.2, 127.3, 232.1; 330/285
See application file for complete search history.

(56) References Cited

U.S. PATENT DOCUMENTS

| | | | |
|---|---|---|---|
| 7,443,246 B2 | 10/2008 | Andrys et al. | |
| 7,944,994 B2 | 5/2011 | Matsuura et al. | |
| 8,223,886 B2 * | 7/2012 | Kitamura et al. | ............. 375/297 |
| 8,260,224 B2 * | 9/2012 | Doherty et al. | ............ 455/127.1 |
| 8,391,406 B2 * | 3/2013 | Kim et al. | ..................... 375/297 |

* cited by examiner

*Primary Examiner* — Sanh Phu
(74) *Attorney, Agent, or Firm* — Knobbe, Martens, Olson & Bear, LLP

(57) ABSTRACT

A system and method are provided for reducing dynamic EVM of an integrated circuit power amplifier (PA) used for RF communication. In a multistage PA, the largest amplification stage is biased with a high amplitude current pulse upon receipt of a Tx enable, before receipt of the RF signal data burst. The high amplitude current pulse causes a large portion of the total ICQ budget of the multistage PA to pass through the largest amplification stage causing the entire integrated circuit to rapidly approach steady-state operating conditions. A smoothing bias current is applied to the largest amplification stage after the pulse decays to compensate for transient bias current levels while standard bias circuitry is still approaching steady-state temperature.

20 Claims, 5 Drawing Sheets

SYSTEM AND METHOD OF PREBIAS FOR RAPID POWER AMPLIFIER RESPONSE CORRECTION

CROSS-REFERENCE TO RELATED APPLICATIONS

This application is a continuation of U.S. patent application Ser. No. 12/629,168 filed Dec. 2, 2009 which is hereby incorporated by reference in its entirety herein.

FIELD OF THE INVENTION

The invention relates to power amplifiers (PA), and more particularly to the correction of the gain and phase response of the PA under changing operating conditions.

BACKGROUND OF THE INVENTION

Correction of the gain and phase response of a power amplifier used to amplify an RF signal transmitted by an RF transmitter (or RF transceiver) can greatly improve the quality of the RF signal and hence the performance of the RF transmitter. Under steady-state operating conditions, an amplifier and its associated circuitry generally perform in an expected, well behaved, and steady manner. Most PAs are designed and tuned so that, if a specific gain bias current (or voltage) is applied to it, it amplifies a signal with a predetermined and steady gain and phase response. This steady gain and phase response holds in general if the PA is operating under steady-state operating conditions, but does not necessarily apply under changing operating conditions.

Changing conditions can lead to changing electromagnetic, electric at and other physical characteristics of the PA, its constituent components, or its associated circuitry. Changes in these physical characteristics can lead to an exhibited gain or phase response of the PA which does not correspond to that which normally accompanies the specific gain bias being applied to the PA. If a physical characteristic fluctuates, and if the gain or phase of the PA is affected by that physical characteristic, so will the exhibited gain or phase response of the PA. As such, changes in the operating conditions of the PA can lead to unwanted changes in the gain or phase response of the PA. Transitioning from an idle state to a full-on state can create a host of various, and possibly interdependent or causally related physical changes which lead to unwanted changes in the gain or phase response of the PA during the transition period.

It should be noted that one consideration for the performance of a PA used in an RF transmitter is what is known as the error vector magnitude (EVM) of the RF signals transmitted. The EVM is a measure of the error in the transmitted signal, characterized by the magnitude of error in the transmitted signal symbol's constellation points versus the constellation point locations of the input signal symbol. The EVM performance of a power amplifier can be measured in terms of the contribution to the EVM of the transmitter created by the amplification applied by the amplifier. All PA's contribute to the EVM to some degree as no PA is an ideal amplifier. Keeping the EVM caused by a PA as small as possible is an important goal in the design and manufacture of PAs.

Although various fluctuations in physical characteristics caused by changing operating conditions can affect the gain or phase response of the PA, the temperature of the PA has a profound affect on its response.

The gain and phase response of a PA varies with temperature such that at temperatures below the steady-state operating temperature, the actual gain exhibited by the PA having a specific bias signal applied thereto will be less than the expected gain of the PA at steady-state operating temperatures in response to that same specific bias signal, and correspondingly, the actual phase response at a specific bias may be different from the expected phase response of the PA at steady-state operating temperatures. As the PA warms up, the actual gain of the PA increases to its expected value while the phase response of the PA approaches an expected steady-state phase response. In order to achieve a desired target operating gain and phase response, a standard or steady-state bias level can be applied to the PA while the PA is operating at its steady-state operating temperature, but at temperatures below the steady-state operating temperature, the standard bias level is insufficient to achieve the target operating response.

The EVM of a PA can increase under pulsed conditions. This increase in EVM is also known as dynamic EVM. This dynamic EVM primarily originates from temporal variations in the gain or phase response of the amplifier when it is experiencing transience, particularly during transitions from idle to steady-state operating conditions.

Due to its profound affect on the gain and phase response of the PA, one main contributor to unwanted changes in a PA's response and dynamic EVM is thermal changes of the PA caused by dynamic heating effects. One particular situation for which this can occur, is when the PA receives an RF signal data burst, after it has remained idle long enough that its temperature has fallen below its steady-state operating temperature. In one standard RF transmitter application, a Tx enable is received 500 ns to 1 μs before the RF signal data to be transmitted is received. Dynamic EVM manifesting as an increase in the EVM occurs primarily at the beginning of the pulse sequence, when the PA is coolest and hence at a temperature farthest from its steady-state operating temperature.

In order to ensure low dynamic EVM and an output signal that is not distorted by unwanted gain and phase variations, a PA is generally not used unless it is thermally stable. A common approach to avoid the problem of dynamic EVM is simply to wait until a PA is thermally stable before using it to amplify the signal. A second common approach is to speed up the gain and phase response of the PA by applying an external resistor and speed-up capacitor to provide more forward current earlier to the PA. Although the speed-up capacitor can improve the time response of the PA, as a passive mechanism it cannot provide the additional forward current until the RF input signal itself arrives. Consequently, the beginning of the RF signal data will suffer from some amount of dynamic EVM and the additional current may not be sufficient to bring the PA into a thermally stable state at a desired rate.

In a multistage PA, each amplification stage ordinarily has a different power range and hence different power and thermal characteristics. Typically the stages of a multistage PA are arranged from the smallest stage, having the lowest power level to the largest stage, having the highest power level as the RF signal is amplified. According to the known solutions for dynamic EVM avoidance, external passive networks are used to either slow down the changing gain response of the first stage or speed up the change in the gain of the second and/or third stages. Another common approach is simply to wait until all of the stage amplifiers including the largest stage amplifier are thermally stable before using the multistage PA to amplify the RF signal.

The external passive networks according to the known solutions possess various packaging and performance compromises. External RC circuits applied to the first and/or second stage can result in reduced output power due to headroom issues of those RC circuits, and result in the addition of further components to the packaging. Use of the speed-up capacitor also requires additional package pins to connect the capacitor across the bias reference current internal port. Any solution utilizing fixed external passive networks requires extensive fine tuning and optimization in the prototype phase. Waiting for all of the stages to become thermally stable, although avoiding dynamic EVM, introduces undesirable delay.

SUMMARY OF THE INVENTION

According to a first aspect, the invention provides for a method of biasing in a power amplifier for RF communication, the method comprising: generating at least one preheat bias signal having an amplitude greater than a steady-state bias level; providing the at least one preheat bias signal to at least one bias input port of amplifier circuitry of the power amplifier, wherein the at least one preheat bias signal is generated and output to the at least one bias input port of the amplifier circuitry prior to receipt of RF signal data to be amplified by the power amplifier, wherein the at least one preheat bias signal causes an operating condition of the amplifier circuitry to approach a steady-state level of the operating condition of the amplifier circuitry, thereby causing at least one of a gain response of the amplifier circuitry to approach a steady-state gain response and a phase response of the amplifier circuitry to approach a steady-state phase response.

In some embodiments of the invention, the amplification circuitry of the power amplifier comprises a plurality of amplification stages, wherein generating the at least one preheat bias signal comprises generating a high amplitude pulse bias signal, wherein providing the at least one preheat bias signal comprises providing the high amplitude pulse bias signal to a bias input port of a stage amplifier of an amplification stage of the plurality of amplification stages, and wherein the high amplitude pulse bias signal causes an operating condition of the stage amplifier to approach a steady-state level of the operating condition of the stage amplifier, thereby causing at least one of a gain response of the stage amplifier to approach a steady-state gain response and a phase response of the stage amplifier to approach a steady-state phase response.

In some embodiments of the invention, the plurality of amplification stages comprises another amplification stage comprising another stage amplifier, wherein the at least one preheat bias signal comprises another pulse bias signal, wherein providing the at least one preheat bias signal comprises providing the another pulse bias signal to a bias input port of the another stage amplifier, wherein the another pulse bias signal causes an operating condition of the another stage amplifier to approach a steady-state level of the operating condition of the another stage amplifier, wherein the stage amplifier has a higher power level than the another stage amplifier, and wherein the high amplitude pulse bias signal is at least one of: different from the another pulse bias signal; and output to the bias input port of the stage amplifier in a manner different from the manner in which the another bias pulse signal is output to the bias input port of the another stage amplifier.

In some embodiments of the invention, an amplitude of the high amplitude pulse bias signal is greater than an amplitude of the another pulse bias signal and wherein the operating condition is temperature.

In some embodiments of the invention, the high amplitude pulse bias signal is output to the bias input port of the stage amplifier prior to the output of the another bias pulse signal to the input port of the another stage amplifier.

In some embodiments of the invention, the high amplitude pulse bias signal output to the bias input port of the stage amplifier causes a high amplitude current pulse to pass through the stage amplifier.

In some embodiments of the invention, the high amplitude current pulse passing through the stage amplifier causes the stage amplifier to rapidly warm-up towards a steady-state operating temperature of the stage amplifier.

In some embodiments of the invention, the high amplitude current pulse passing through the stage amplifier causes the stage amplifier to warm-up to an intermediate temperature which is less than the steady-state operating temperature of the stage amplifier.

Some embodiments of the invention further provide for: generating a smoothing bias signal; and providing the smoothing bias signal to the bias input port of the stage amplifier, wherein the smoothing bias signal is generated and output to the bias input port of the stage amplifier prior to the receipt of the RF signal data.

In some embodiments of the invention, generating the smoothing bias signal is performed while the high amplitude current pulse decays and once the stage amplifier reaches the intermediate temperature, and wherein the smoothing bias signal output to the bias input port of the stage amplifier causes a smoothing current to pass through the stage amplifier.

In some embodiments of the invention, the smoothing bias signal is generated such that it comprises a slowly decaying reference signal.

Some embodiments of the invention further provide for: generating a standard bias signal; and providing the standard bias signal to the bias input port of the stage amplifier, wherein the smoothing current compensates for transience in a current passing through the stage amplifier.

In some embodiments of the invention, the smoothing bias signal decays to zero as an amplitude of the standard bias signal ramps up to a steady-state bias level.

Some embodiments of the invention further provide for: generating timing control signals after generating the high amplitude pulse bias signal has completed; wherein the step of generating the standard bias signal is performed in response to the generation of the timing control signals.

In some embodiments of the invention, generating timing control signals comprises generating a specific timing control signal and wherein the step of generating the standard bias signal is performed in response to the generation of the specific timing control signal.

In some embodiments of the invention, generating timing control signals comprises generating a change in the timing control signals and wherein the step of generating the standard bias signal is performed in response to the generation of the change in the timing control signals.

In some embodiments of the invention, the generating of the high amplitude pulse bias signal is performed in response to receipt by the power amplifier of an anticipatory notification that receipt of the RF signal data is imminent.

In some embodiments of the invention, the anticipatory notification comprises a Tx enable signal.

Some embodiments of the invention further provide for: generating first control signals, wherein generating the high amplitude pulse bias signal comprises generating the high amplitude pulse bias signal with a specified pulse amplitude and a specified pulse duration, wherein the specified pulse amplitude and the specified pulse duration are adjustable in dependence upon the first control signals.

Some embodiments of the invention further provide for: generating second control signals, wherein generating the smoothing bias signal comprises generating the smoothing bias signal with a specified smoothing amplitude and a specified smoothing decay rate, wherein the specified smoothing amplitude and the specified smoothing decay rate are adjustable in dependence upon the second control signals.

In some embodiments of the invention, the smoothing current compensates for transience in the gain and phase response of the stage amplifier due to transience in the temperature of the stage amplifier while it continues to warm-up from the intermediate temperature to the steady-state operating temperature.

According to another aspect, the invention provides for a bias circuit of a power amplifier for RF communication, the bias circuit comprising: a preheat bias circuit for generating at least one preheat bias signal having an amplitude greater than a steady-state bias level the preheat bias circuit coupled to at least one bias input port of amplifier circuitry of the power amplifier and for providing the at least one preheat bias signal to the at least one bias input port, wherein the preheat bias circuit generates the at least one preheat bias signal and outputs the at least one preheat bias signal to the at least one bias input port of the amplifier circuitry prior to receipt of RF signal data to be amplified by the power amplifier, and wherein the at least one preheat bias signal causes an operating condition of the amplifier circuitry to approach a steady-state level of the operating condition of the amplifier circuitry, thereby causing at least one of a gain response of the amplifier circuitry to approach a steady-state gain response and a phase response of the amplifier circuitry to approach a steady-state phase response.

In some embodiments of the invention, the amplification circuitry of the power amplifier comprises a plurality of amplification stages, wherein the at least one preheat bias signal comprises a high amplitude pulse bias signal, wherein providing the at least one preheat bias signal comprises providing the high amplitude pulse bias signal to a bias input port of a stage amplifier of an amplification stage of the plurality of amplification stages, and wherein the high amplitude pulse bias signal causes an operating condition of the stage amplifier to approach a steady-state level of the operating condition of the stage amplifier, thereby causing at least one of a gain response of the stage amplifier to approach a steady-state gain response and a phase response of the stage amplifier to approach a steady-state phase response.

In some embodiments of the invention, the high amplitude pulse bias signal causes a high amplitude current pulse to pass through the stage amplifier.

Some embodiments of the invention further provide for a smoothing bias circuit for generating a smoothing bias signal, the smoothing bias circuit coupled to the bias input port of the stage amplifier and for providing the smoothing bias signal to the bias input port of the stage amplifier, wherein the smoothing bias circuit generates the smoothing bias signal and outputs the smoothing bias signal to the input port of the stage amplifier prior to receipt of RF signal data to be amplified by the power amplifier.

In some embodiments of the invention, the smoothing bias circuit generates the smoothing bias signal while the high amplitude current pulse decays and once the stage amplifier reaches the intermediate temperature, and wherein the smoothing bias signal causes a smoothing current to pass through the stage amplifier.

In some embodiments of the invention, the smoothing bias signal comprises a slowly decaying reference signal.

Some embodiments of the invention further provide for: a standard bias circuit for generating a standard bias signal, the standard bias circuit coupled to the bias input port of the stage amplifier and for providing the standard bias signal to the bias input port of the stage amplifier, wherein the smoothing current compensates for transience in a current passing through the stage amplifier.

In some embodiments of the invention, the preheat bias circuit is coupled to the standard bias circuit by a timing control connection, wherein the preheat bias circuit generates timing control signals once generation of the high amplitude pulse bias signal has completed and transmits the timing control signals over the timing control connection, and wherein the standard bias circuit generates the standard bias signal in response to receiving the timing control signals over the timing control connection.

In some embodiments of the invention, the standard bias circuit generates the standard bias signal when it receives a specific timing control signal of the timing control signals.

In some embodiments of the invention, the standard bias circuit generates the standard bias signal when the standard bias circuit detects a change in the timing control signals received over the timing control connection.

In some embodiments of the invention, the preheat bias circuit generates the high amplitude pulse bias signal in response to receipt by the power amplifier of an anticipatory notification that receipt of the RF signal data is imminent.

In some embodiments of the invention, the preheat bias circuit generates the high amplitude pulse bias signal with a specified pulse amplitude and a specified pulse duration, wherein the specified pulse amplitude and the specified pulse duration are adjustable by first control signals received by the preheat bias circuit from at least one controller.

In some embodiments of the invention, the smoothing bias circuit generates the smoothing bias signal with a specified smoothing amplitude and a specified smoothing decay rate, wherein the specified smoothing amplitude and the specified smoothing decay rate are adjustable by second control signals received by the smoothing bias circuit from the at least one controller.

Some embodiments of the invention further provide for: a first combiner having a first input coupled to the preheat bias circuit and a second input coupled to the smoothing bias circuit and is for generating a combined bias signal comprising a combination of the high amplitude pulse bias signal and the smoothing bias signal; and a second combiner having a first input coupled to the standard bias circuit and a second input coupled to the first combiner for receiving the combined bias signal, the second combiner for combining the combined bias signal with the standard bias signal generating a biasing signal to be applied to the bias input port of the stage amplifier.

In some embodiments of the invention, the smoothing bias signal is generated such that it comprises a slowly decaying reference signal.

BRIEF DESCRIPTION OF THE DRAWINGS

The features and advantages of the invention will become more apparent from the following detailed description of the preferred embodiment(s) with reference to the attached figures, wherein.

Figure 1:
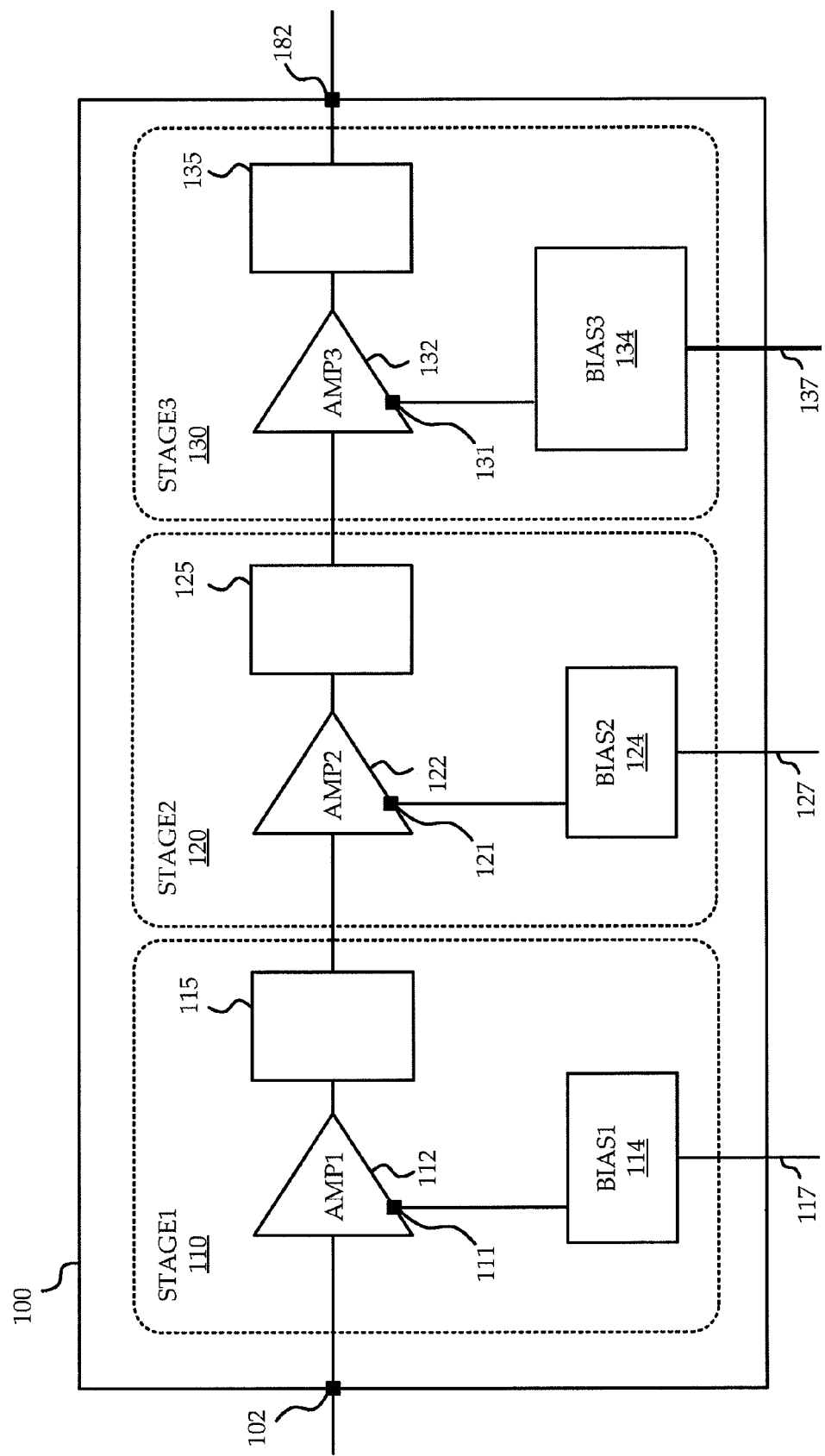
FIG. 1 is a block diagram of a three stage power amplifier according to an embodiment of the invention.

It is noted that in the attached figures, like features bear similar labels.

DETAILED DESCRIPTION OF THE PREFERRED EMBODIMENT

The embodiments described below illustrate features of the invention in the context of an Integrated Chip (IC) power amplifier. It is to be understood that the invention applies to a power amplifier of any type, including among others, a power amplifier which is Bipolar based, tube based, or any combination thereof, as long as the power amplifier utilizes biasing voltage or current signals to set the gain or phase response of its amplification, and would benefit from compensation to minimize distortion due to changing gain or phase response during the arrival of the input signal.

The invention described herein below mitigates the aforementioned drawbacks of known systems by limiting the need for off-chip passive components, reducing the time necessary to achieve steady state gain and phase response, improving dynamic EVM performance of PAs, reducing fine tuning and optimization in the prototype phase, and compensating for secondary thermal time constants associated with IC power amplifier packaging.

Referring to FIG. I, a multistage PA 100 having additional stage three biasing circuitry according to the invention will now be discussed in terms of structure. The multistage PA 100 has an RF input port 102 which is coupled in series with three amplification stages of the multistage PA 100, namely, a first amplification stage 110 (STAGE1), a second amplification stage 120 (STAGE2), and a third amplification stage 130 (STAGE3), and an RF output port 182 of the multistage PA 100. Three amplification stages 110, 120, 130 are coupled in series along a signal path and coupled to associated bias circuitry. In the embodiment shown, the first amplification stage 110 has a first stage amplifier 112 (AMP1) coupled in series with first signal conditioning circuitry 115 and coupled to associated first stage bias circuitry 114 (BIAS1), while the second amplification stage 120 has a second stage amplifier 122 (AMP2) coupled in series with second signal conditioning circuitry 125 and coupled to associated second stage bias circuitry 124 (BIAS2), and the third amplification stage 130 has a third stage amplifier 132 (AMP3) coupled in series with third signal conditioning circuitry 135 and coupled to associated third stage bias circuitry 134 (BIAS3). For example, third signal conditioning circuitry includes impedance matching circuitry. In the embodiment shown, the third amplification stage 130 has third stage bias circuitry 134 which includes additional bias circuitry to improve dynamic EVM performance of the multistage PA 100 as described below. Each stage bias circuitry 114, 124, 134 of the amplification stages 110, 120, 130, is coupled via a control connection or bus to one or more bias controllers (not shown). The first stage bias circuitry 114 is coupled by a first bias control connection 117, the second stage bias circuitry 124 is coupled by a second bias control connection 127, and the third stage bias circuitry 134 is coupled by a serial bias control bus 137. In some embodiments, the bias control bus 137 is parallel. It should be understood that in alternative embodiments the second amplification stage 120 (or even the first amplification stage 110, if the first stage amplifier 112 were large enough) could also include additional bias circuitry which improves dynamic EVM performance and be connected by a serial or parallel control bus to a bias controller or controllers. In the embodiment shown, each stage amplifier 112, 122, 132 is coupled to the associated bias circuitry 114, 124, 134 at a respective bias input port 111, 121, 131 of the stage amplifier 112, 122, 132.

The multistage PA 100 of FIG. 1 will now be described in terms of its function. The multistage PA 100 receives over the RF input port 102 an RF input signal for amplification. The RF input signal is passed through each of the amplification stages 110, 120, 130 and a resulting amplified RF output signal is output from the multistage PA 100 over the RF output port 182. The operation of each of the stage amplifiers 112, 122, and 132 is biased by the associated bias circuitry 114, 124, 134, each of which is controlled by one or more bias controllers. Standard and well known forms of biasing enable the manipulation of various characteristics of the stage amplifiers 112, 122, 132 for various purposes. For the purposes of the embodiment shown, the type of biasing of interest is that applied in addition to the standard steady-state biasing, namely, the bias applied by the associated bias circuitry to the stage amplifiers in order to compensate for the transient bias levels while the standard bias circuit is still equalizing in temperature to the amplification stage. The signal conditioning circuitry 115, 125, 135 serve to filter and shape the amplified signal emerging from the corresponding stage amplifier 112, 122, 132. It should be noted that signal conditioning circuitry 115, 125, 135 are ancillary circuits and although common in PAs may not be needed in some PA applications.

Figure 2:
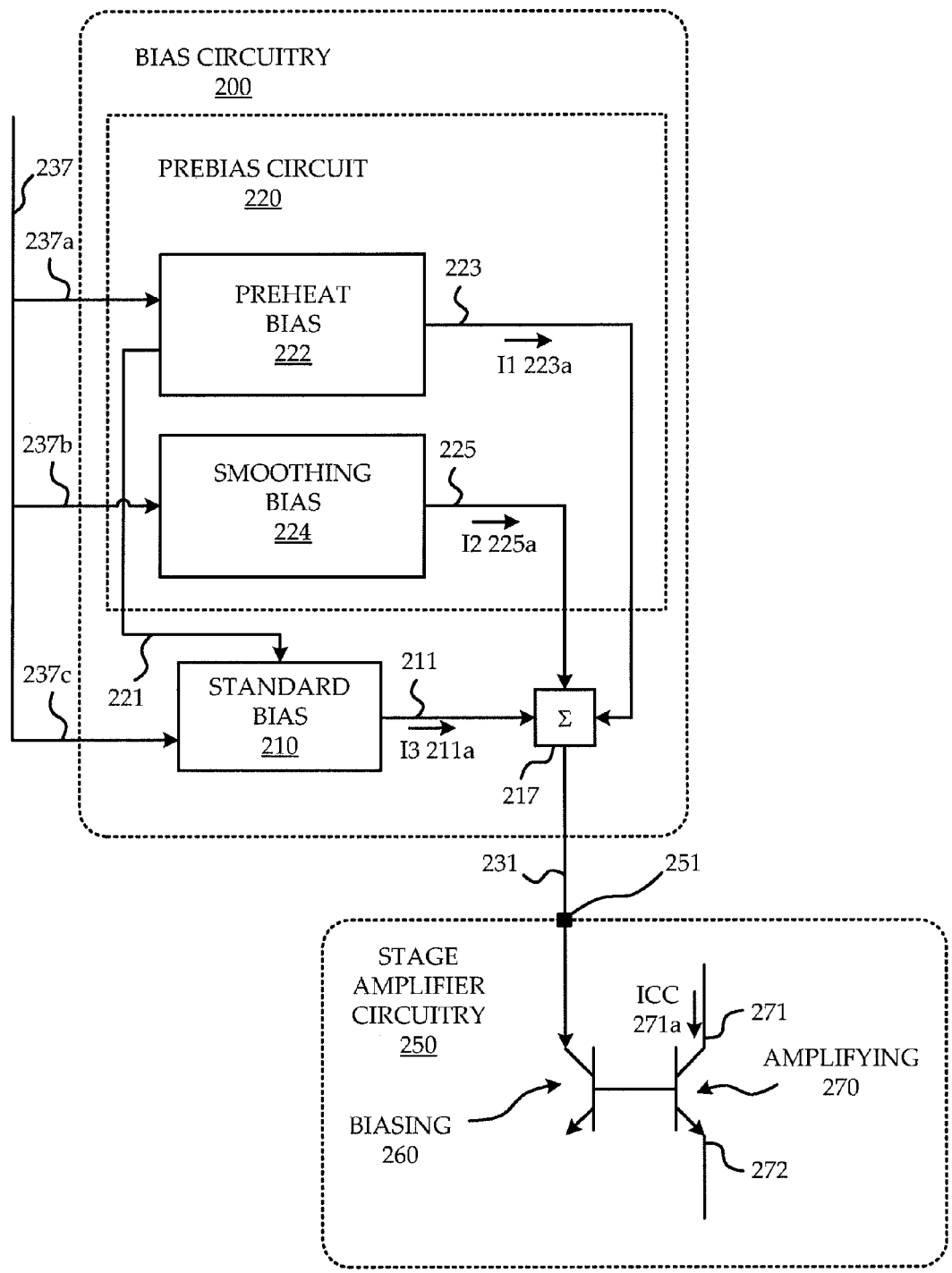
FIG. 2 is a block diagram illustrating the biasing of a stage amplifier according to an embodiment of the invention.

Referring now also to FIG. 2 an embodiment that includes the aforementioned additional bias circuitry for improving dynamic EVM will now be described in terms of its structure. Bias circuitry 200 of the embodiment depicted in FIG. 2 forms part of the bias circuitry of a single amplification stage of a multistage PA such as the associated third bias circuitry 134 of the third amplification stage 130 of FIG. 1.

Bias circuitry 200 comprises a prebias circuit 220, a standard bias circuit 210, and a combiner 217. The prebias circuit 220 comprises a preheat bias circuit 222 and a smoothing bias circuit 224. The preheat bias circuit 222, the smoothing bias circuit 224, and the standard bias circuit 210 are all independent open loop current sources which have very rapid enable capability. The preheat bias circuit 222 and the smoothing bias circuit 224 are coupled respectively by a first and second connection 223, 225 to the combiner 217. A timing control connection 221 is coupled from the preheat bias circuit 222 to the standard bias circuit 210. The standard bias circuit 210 is coupled by a third connection 211 to the combiner 217. First, second, and third bias control bus connections 237a, 237b, and 237c respectively couple the preheat bias circuit 222, the smoothing bias circuit 224, and the standard bias circuit 210, to a bias controller or controllers (not shown). An output current of the combiner 217 is coupled to a bias input port 251 of stage amplifier circuitry 250 over a bias connection 231.

The stage amplifier circuitry 250 forms part of the stage amplifier of a single amplification stage of a multistage PA such as the third stage amplifier 132 of the third amplification stage 130 of FIG. 1. The bias connection 231 is coupled to a biasing transistor 260 of the stage amplifier circuitry 250. The bias input port 251 is coupled in a current mirror configuration with an amplifying transistor 270 of the stage amplifier circuitry 250. The amplifying transistor 270 has a collector 271 and an emitter 272. The amplifying transistor 270 of the stage amplifier circuitry 250 is used to amplify the RF signal passing through the amplification stage of the multistage PA of which the stage amplifier circuitry 250 forms a part.

For example, when the bias circuit controller is a digital control circuit, the controller optionally supports an adjustable delay and adjustable bias levels. Alternatively, only one of the bias level and the delay is adjustable. Further alternatively, neither are adjustable. In another embodiment, adjustable delay or bias current is achieved using an analogue circuit.

The embodiment depicted in FIG. 2 will now be described in terms of its function. Bias circuitry 200 is used to generate a biasing current that is output over the bias connection 231 to the stage amplifier circuitry 250. The biasing current received by the stage amplifier circuitry 250 over bias input port 251 is used to drive, in an open loop current mirror configuration, a collector current 271a (ICC) of the collector 271 of the amplifying transistor 270. This form of current biasing ensures that the current on the signal side of the current mirror that passes through the amplifying transistor 270 is limited by the circuitry supplying the available operating current to that amplifying transistor 270. In the embodiment depicted in FIG. 1 and FIG. 2, the available operating current for amplification of the RF signal is shared between the amplifying transistors of all the amplification stages. As the biasing current varies, the collector current 271a follows, and although the collector current magnitude is greater than the biasing current, it does not exceed the entire ICQ budget for the stage amplifiers of the multistage PA. Alternatively, the ICQ budget is exceeded by storing current for later retrieval for example in a resistor capacitor (RC) circuit. As current flows through the amplifying transistor 270 heat is generated.

The biasing current output over the bias connection 231 is a summation generated by the combiner 217 of current it receives from the standard bias circuit 210, from the smoothing bias circuit 224, and from the preheat bias circuit 222. It should be noted that each of the preheat, smoothing, and standard biasing circuits 222, 224, 210 is pre-charged to save turn on time.

In response to a Tx enable or other similar anticipatory notification that the RF signal data is imminent, the one or more bias controllers initiate operation of the preheat bias circuit 222 by first bias control signals sent over first bias control bus connection 237a. In response to the first bias control signals, the preheat bias circuit 222 generates a preheat bias current 223a (I1) and outputs the preheat bias current 223a over the first connection 223 to the combiner 217.

Figure 3:
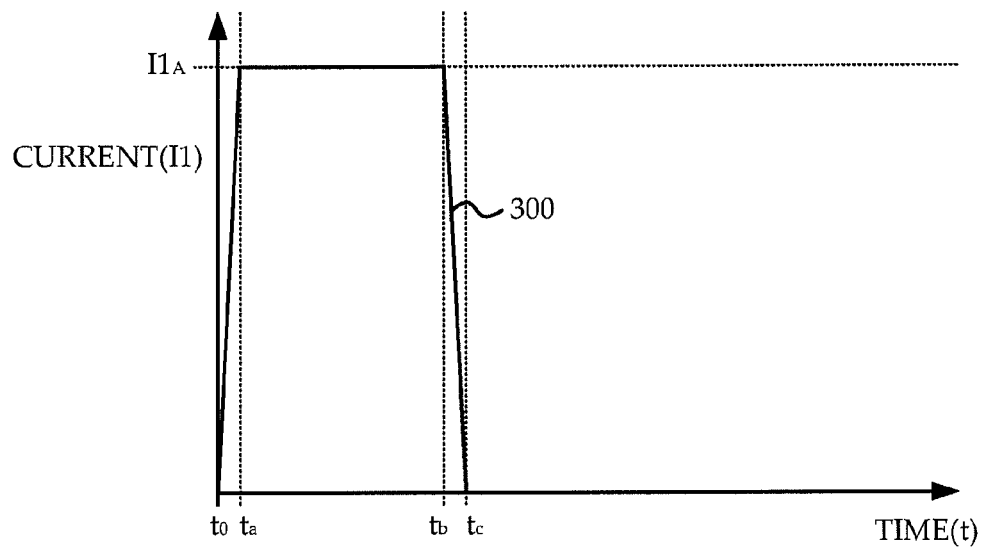
FIG. 3 is a graphical representation of preheat bias current versus time according to an embodiment of the invention.

This preheat bias current 223a, is represented graphically 300 in FIG. 3. At time $T_0$ the preheat bias circuit 222 receives the first bias control signals and begins to generate a high amplitude current pulse which reaches its maximum current ($I1_A$) at time $t_a$. At a later time $t_b$, the preheat bias circuit 222 stops producing current, and the current drops to 0 by the time $t_c$. The amplitude and duration ($t_b$-$t_0$) of the high amplitude current pulse may be fine tuned with adjustments to the first bias control signals being sent over the first bias control bus connection 237a. The magnitude of the high amplitude current pulse produced by the preheat bias circuit 222 is much greater than the standard bias level applied during normal operation when the amplifying transistor 270 is operating at the steady-state temperature. The duration ($t_b$-$t_0$) of the high amplitude current pulse is generally on the order of tens of microseconds. When the preheat bias circuit 222 stops generating the preheat bias current 223a at time $t_b$, the preheat bias circuit 222 performs one of sending a specific timing control signal over timing control connection 221 to the standard bias circuit 210 or changing timing control signals which have been continuously sent over timing control connection 221 to the standard bias circuit 210. This specific timing control signal or alternatively the change in the timing control signals indicates when the standard bias circuit 210 should begin ramping up the standard bias current 211a and as such gates the operation of the standard bias circuit 210.

As will be described hereinbelow in association with FIG. 6, the result of the high amplitude current pulse input signal over the bias input port 251 of the stage amplifier circuitry 250 is a mirrored current flowing through the amplifying transistor 270 which is approximately two times the magnitude of the steady-state current which normally flows through the amplifying transistor 270.

In response to the Tx enable or the other similar anticipatory notification, the one or more bias controllers initiate operation of the smoothing bias circuit 224 by second bias control signals sent over the second bias control bus connection 237b. In response to the second bias control signals, the smoothing bias circuit 224 generates a smoothing bias current 225a (I2) and outputs the smoothing bias current 225a over the second connection 225 to the combiner 217. In some embodiments the smoothing bias circuit 224 includes time delay circuitry which is adjustable via the second bias control signals sent over the second bias control bus connection 237b, so that it begins generating its smoothing bias current 225a while the preheat bias current 223a from the preheat bias circuit 222 is decaying. Alternatively, it begins generating its smoothing bias current 225a after the preheat bias current 223a from the preheat bias circuit 222 has approximately finished decaying. In other embodiments, the smoothing bias circuit 224 receives a separate bias control signal over the second bias control bus connection 237b at the appropriate instant the smoothing bias circuit 224 should begin producing the smoothing bias current 225a.

Figure 4:
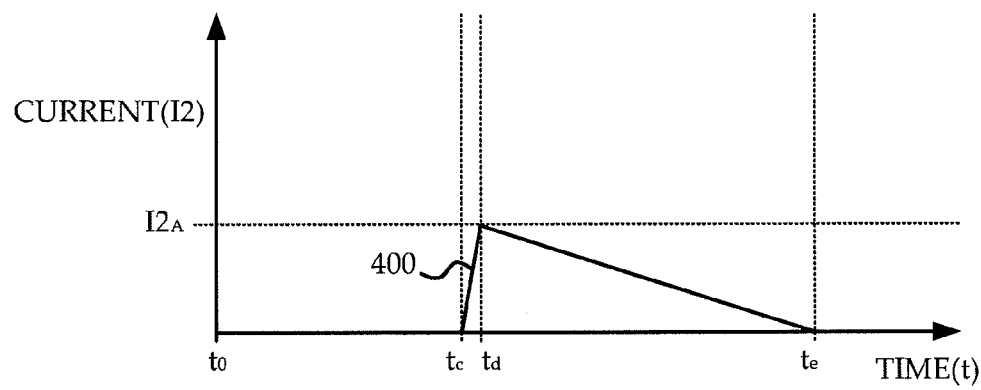
FIG. 4 is a graphical representation of smoothing bias current versus time according to an embodiment of the invention.

The smoothing bias current 225a is represented graphically 400 in FIG. 4. At time $t_c$ the smoothing bias circuit 224 begins producing the smoothing bias current 225a. The smoothing bias current 225a quickly rises to its peak value ($I2_A$) at time $t_d$ after which it smoothly and slowly decays finally reaching zero at time $t_e$. The decay rate and peak amplitude of the smoothing bias current 225a are adjustable by the second bias control signals received by the smoothing bias circuit 224 over the second bus control connection 237b. This smoothing bias current 225a is provided in order to smooth the transition of the amplifying transistor 270 to normal operation by compensating for the transient gain and phase resulting from the amplifier circuitry and standard bias circuit's still equalizing in temperature. The smoothing bias current 225a is a reference current, fractional in magnitude to the final bias current $ICC_B$ discussed below in association with FIG. 6.

In response to receipt of the specific timing control signal or in response to a change in the timing control signals over timing control connection 221, the standard bias circuit 210 begins ramping up a standard bias current 211a (13) towards the standard bias level it provides during normal operation of the amplifying transistor 270, and outputs the standard bias current 211a over the third connection 211 to the combiner 217. As described hereinabove, the standard bias current 211a is gated by completion of the high amplitude current pulse of the preheat bias current 223a at time $t_c$. In other embodiments, the standard bias circuitry includes time delay circuitry for holding off the standard bias current ramp until the high amplitude current pulse decays after several hundred nanoseconds. This time delay circuitry is adjustable via the third bias control signals sent over the third bias control bus connection 237c.

Figure 5:
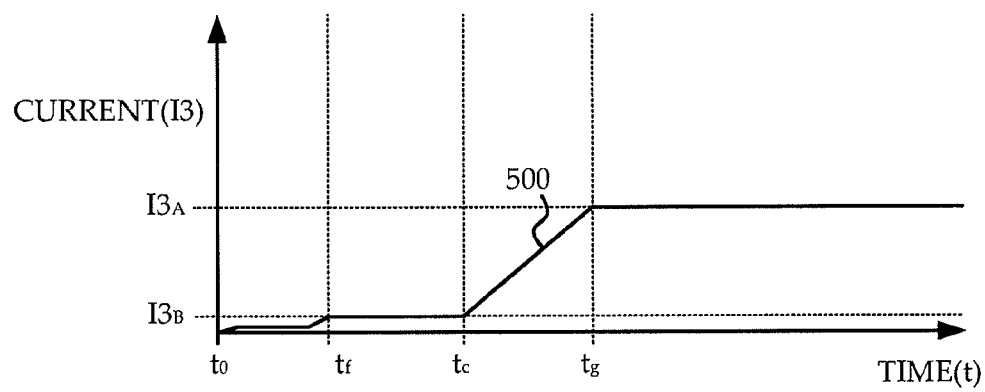
FIG. 5 is a graphical representation of standard bias current versus time according to an embodiment of the invention.

The standard bias current 211a is represented graphically 500 in FIG. 5. At time $t_0$ the standard bias circuit 210 is turned on and by time $t_f$ the bandgap stabilizes and the standard bias circuit is producing a small current $13_B$. The standard bias current 211a remains at a level $13_B$ until time $t_c$ at which point it ramps up to the standard bias current level $13_A$ at time $t_g$ the time at which the power amplifier is fully on has not yet reached steady-state.

Figure 6:
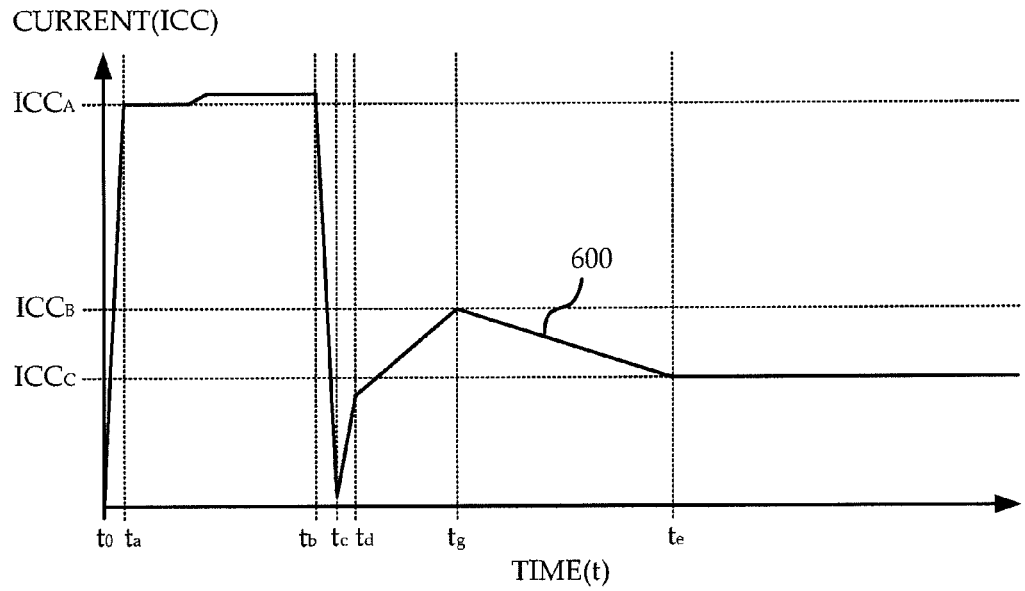
FIG. 6 is a graphical representation of the total current ($I_{CC}$) of the amplifying transistor versus time according to an embodiment of the invention.

The collector current 271a of the collector 271 of the amplifying transistor 270 is represented graphically 600 in FIG. 6. At time $t_0$ in response to the high amplitude current pulse generated by the preheat bias circuit 222 being input over the bias input port 251 to the biasing transistor 260, a mirrored high amplitude current pulse passes through the amplifying transistor 270 until time $t_b$. The magnitude of the mirrored high amplitude current pulse ($ICC_A$) is approximately twice that which is normally applied through the amplifying transistor 270 during steady-state operation namely, ($ICC_C$). In some embodiments of the invention, this current $ICC_A$ constitutes the entire ICQ budget for the multistage PA. In other embodiments, it represents a disproportionate share of the ICQ less than the whole. Between time $t_c$ and $t_g$ a mirrored current pulse rising to a current level of $ICC_B$ is generated by the smoothing and standard bias currents 224a 225a being combined and applied over the bias input port 251 to the biasing transistor 260. This combined current decays between times $t_g$ and $t_e$ to the final steady-state current value of $ICC_C$ caused by the standard bias current level $13_A$ after the standard bias current has fully ramped up, and the smoothing bias current fallen to zero.

Figure 7:
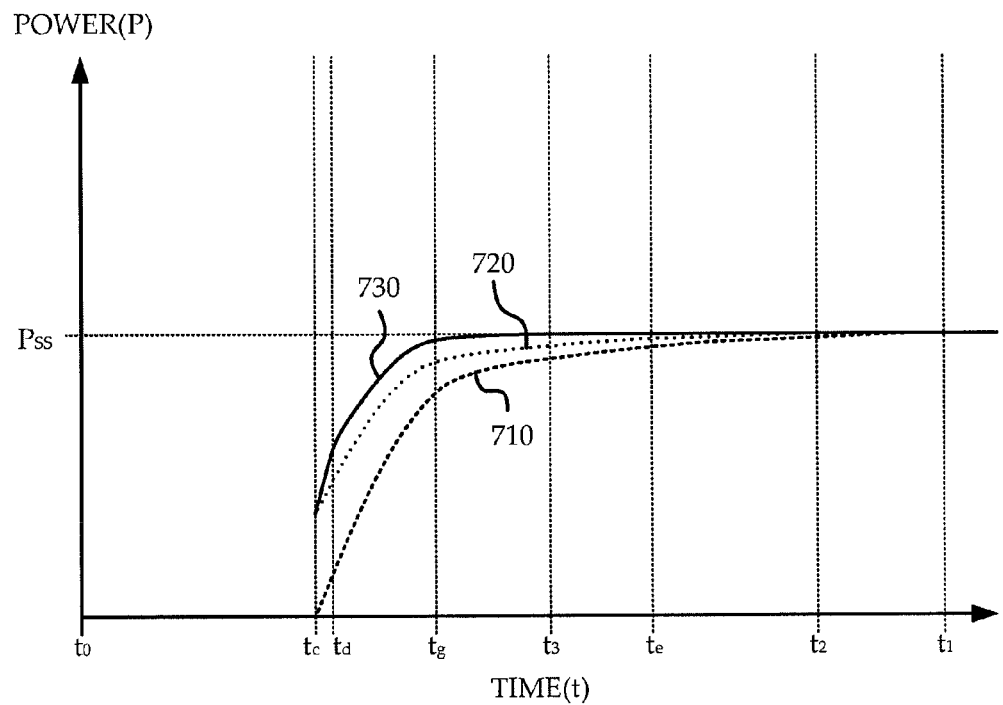
FIG. 7 is a graphical representation of the power response of the amplifying transistor versus time according to an embodiment of the invention.

The gain response, in the form of a power (P) output of the amplified RF signal, of the amplifying transistor 270 is represented graphically 730 in FIG. 7. For illustrative purposes, a gain response, which would be obtained without the application of any smoothing bias current 225a is depicted by dotted line 720, and a gain (or phase) response which would obtain without the application of any preheat bias current 223a or any smoothing bias current 225a is depicted by dashed line 710. The gain response 710 which obtains without application of any smoothing or preheat bias current reaches the expected steady-state power level $P_{SS}$ at time $t_1$. The gain response 720 which obtains without application of any smoothing current but with application a preheat bias current reaches the expected steady-state power level $P_{SS}$ at time $t_2$ which occurs before time $t_1$. The gain response 730 of the amplifying transistor 720 with application of the smoothing bias current and the preheat bias current as described hereinabove, reaches the expected steady-state power level $P_{SS}$ at time $t_3$ which is much earlier than either time $t_1$ or time $t_2$.

With reference to FIG. 3 through 6, it is apparent that the high amplitude current pulse is applied before and while the standard bias circuit 210 is powering up and prior to the standard bias current reaching its target value, and decays with sufficient speed to keep total instantaneous ICQ close to its final steady-state value. The mirrored high amplitude current pulse of approximately two or more times the steady-state current flowing through the amplifying transistor 270 causes it to rapidly heat closer to its final steady-state operating temperature. The mirrored high amplitude current pulse also serves to reduce the final gain change of the device once in use. As can be seen in FIG. 7, the gain (or phase) response is the same as or extremely close to its final steady-state value $P_{SS}$ as early as time $t_3$.

Figure 8:
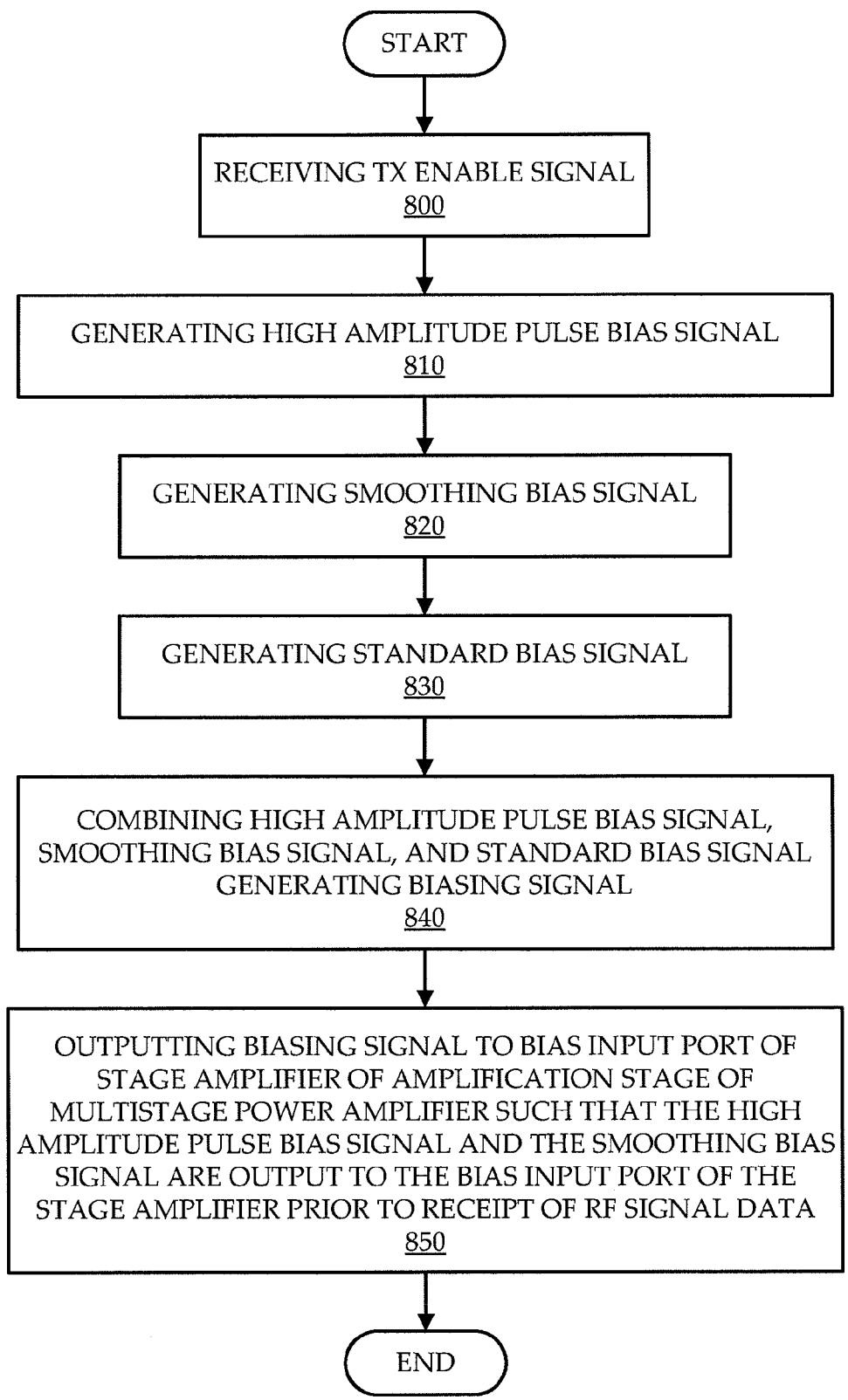
FIG. 8 is a functional block diagram illustrating a general method according to an embodiment of the invention.

Referring to FIG. 8, a general method of biasing according to an embodiment of the invention will now be described. At step 800 the multistage amplifier receives a Tx enable signal. A prebias circuit generates at step 810 a high amplitude pulse bias signal and at step 820 a smoothing bias signal. At step 830 a standard bias signal is generated typically by a standard bias circuit. At step 840 a bias circuitry likely including at least one the combiner combines the high amplitude pulse bias signal the smoothing bias signal and the standard bias signal generating a biasing signal. At step 850 the biasing signal is output to a bias input port of a stage amplifier of an amplification stage of the multistage power amplifier, such that the high amplitude pulse bias signal and the smoothing bias signal are output to the bias input port of the stage amplifier prior to receipt of RF signal data.

Although in the above description of the embodiments temperature has been focused upon as the operating condition which is compensated for and corrected by the application of the preheat bias current and the smoothing bias current, and whose fluctuations contribute to the dynamic EVM, it should be understood that the invention is directed to compensation and correction, by application of the preheat bias current and the smoothing bias current as described above, of any operating condition which affects the dynamic EVM of the PA or the gain or phase response of the PA. Generally speaking, the invention contemplates use of the high amplitude current pulse and the smoothing current in the biasing signal to bring the operating conditions of the amplifier circuitry towards steady state levels and thereby stabilize the gain and phase response of the PA and reduce dynamic EVM.

Although, as described above the bias circuits are precharged to save turn on time, the IDAC (Integrated Digital to Analog Converter) (not shown) final output signals are optionally held off until the mirrored high amplitude current pulse is done. The form and timing of the various bias currents fed into the bias input port 251 causes the total ICQ of the PA to remain near its steady-state target, while at the same time causing the entire ICQ budget to pass through the final amplification stage in the first few hundred nanoseconds (or up to 10's of microseconds) of operation. As the initial current pulse dies away, the smoothing current decays, and the final current reference ramps up to its final value, the ICQ budget of the multistage PA rebalances between the stages of the PA to the normal expected operating ratios.

In some embodiments of the invention, dynamic EVM improving circuitry including the prebias circuit 220, the combiner 217, the timing control connection 221, and the first and second bias control bus connections 237a, 237b can be added to existing known bias circuits with simple retrofit to design refreshes. Consequently, embodiments of the invention may be obtained in the act of improving existing bias circuits by wrapping the dynamic EVM improving circuitry described hereinabove around the existing bias circuits.

In some embodiments, the duration and magnitude of the pulses are adjusted using either metal changes or bus addressing, although a reduction in the time required for dynamic EVM optimization is better achieved through adjustments made to the duration and magnitude via control signals sent over a control bus. Moreover, bus addressing allows more flexibility in the configuration of the bias circuits when deployed in various differing applications. These bus addresses may also be wired to "final" settings as needed by application such that the PA autonomously sequences through the proper timing and amplitude ranges.

As discussed hereinabove, the circuitry of FIG. 2 can also be used on one or all stages of a multistage PA to varying degrees.

The embodiments depicted in FIG. 1 and FIG. 2 may be implemented using, for each of the preheat bias circuit 222, the smoothing bias circuit 224, and the standard bias circuit 210, existing proven bias structures.

Although the embodiment described in association with FIG. 2 has been illustrated with a simplified stage amplifier circuitry having a single bias transistor in a current mirror configuration with a single amplifying transistor, it should be understood that the amplifier circuitry can comprise any open loop current biasing structure for receiving a biasing current and causing current to be mirrored in a respective amplifying transistor or amplifying transistor array.

Although prebias circuit 220 of the embodiment depicted in FIG. 2 has been described as outputting two separate currents, namely, the preheat bias current 223a and the smoothing bias current 225a, in some embodiments the prebias circuit 220 outputs a single prebias current and provides it to the combiner 217. In those embodiments in which the prebias circuit 220 provides a single current to the combiner 217, the prebias circuit 220 can either comprise separate preheat bias and smoothing bias circuits 222, 224 which produce respectively a preheat bias current and a smoothing bias current which are added together in the prebias circuit 220, or can comprise custom prebias circuitry which generates a single prebias current equivalent to the combination of the preheat bias current and the smoothing bias current of the embodiment depicted in FIG. 1 and FIG. 2.

Although the embodiments of the invention have been described in terms of current sources providing various biasing currents, voltage sources could be used in an implementation in which the stage amplifiers are configured to accept a voltage input to bias the amplifier. In such an implementation, the stage amplifier circuitry contains structures to convert the voltage into a coordinate application of current to the amplifying transistor or amplifying transistor array. Due to this conversion, there may be different levels of pulse tolerance.

Although the embodiments have been described hereinabove as implementations utilizing primarily the new features and elements of the invention, some embodiments contemplate combinations of the new features and elements of the invention with known techniques, such as speed-up circuits and delay lines, although such implementations would generally not be as advantageous as the embodiments described hereinabove. Once example of such an embodiment is one which does not utilize an anticipatory notification to commence generation of the preheat bias current but instead commences generation of the preheat bias current upon receipt of the RF signal data, and uses a delay line to delay the RF signals long enough so that with the application of the high amplitude pulse bias, the amplifier circuitry attains steady-state by the time the RF signals pass therethrough.

Though specific timing is described for a present application, it is understood that as RF signal rates change and for different applications, different pre-heat timing and delays are advantageous and can be determined as part of the design process. These variations in timing and amplitudes are also capable of compensating for gain and phase of the IC when placed into semiconductor packages with differing thermal time constants, e.g. different settings may be needed on the same IC when used in different packages.

The embodiments presented are exemplary only and persons skilled in the art would appreciate that variations to the embodiments described above may be made without departing from the spirit of the invention. The scope of the invention is solely defined by the appended claims.

What is claimed is:

1. A method of biasing in a power amplifier for RF communication, the method comprising:
generating a high amplitude pulse bias signal in response to an indication of an RF signal to be amplified by a multi-stage power amplifier is imminent, an amplitude and duration of the high amplitude pulse bias signal based at least in part on a first control signal, the amplitude of the high amplitude pulse bias signal being greater than a steady-state bias level;
generating a standard bias signal approximately when the high amplitude pulse bias signal begins to decay;
generating a smoothing bias signal, a peak amplitude and decay rate of the smoothing bias signal based at least in part on a second control signal;
combining the high amplitude pulse bias signal, the standard bias signal, and the smoothing bias signal to generate a first combined bias signal; and
providing the first combined bias signal to a bias input port of a final amplifying stage of the multi-stage power amplifier, the combined bias signal causing an operating condition of the final amplifying stage to approach a steady-state level.

2. The method of claim 1 further comprising generating the smoothing bias signal when the high amplitude pulse bias signal approximately finishes decaying.

3. The method of claim 1 further comprising generating the smoothing bias signal while the high amplitude pulse bias signal decays.

4. The method of claim 1 further comprising providing a timing control signal indicating when to generate the standard bias signal.

5. The method of claim 1 wherein the high amplitude pulse bias signal is approximately twice the steady-state bias level.

6. The method of claim 1 further comprising generating a second combined bias signal and providing the second combined bias signal to a bias input port of a second amplifying stage of the multi-stage power amplifier, the second combined bias signal being generated independent from the first combined bias signal.

7. The method of claim 1 wherein the first combined bias signal compensates for transient bias levels while standard bias circuitry generating the standard bias signal is equalizing in temperature.

8. A power amplifier comprising:
a plurality of amplification stages coupled in series along a signal path, the plurality of amplification stages configured to amplify a radio frequency (RF) signal received at an RF input port and to provide an amplified RF signal at an RF output port, each amplification stage including a bias input port and at least one biasing transistor in a mirror configuration with at least one amplifying transistor; and
bias circuitry associated with each amplification stage, each bias circuitry including preheat bias circuitry configured to provide a high amplitude pulse bias signal in response to an indication that receipt of the RF signal is imminent, smoothing bias circuitry configured to provide a smoothing bias signal in response to an indication of decay of the high amplitude pulse bias signal, and a combiner configured to combine the high amplitude pulse bias signal and the smoothing bias signal to provide a combined bias signal, each biasing input port configured to receive the combined bias signal which, when received by the amplification stage, causes an operating condition of the amplification stage to approach a steady-state level.

9. The power amplifier of claim 8 wherein an amplitude and duration of the high amplitude pulse bias signal are based at least in part on a first control signal.

10. The power amplifier of claim 9 wherein a peak amplitude and decay rate of the smoothing bias signal are based at least in part on a second control signal.

11. The power amplifier of claim 8 wherein the operating condition is temperature.

12. The power amplifier of claim 8 wherein the at least one biasing transistor is configured to receive the combined bias signal and the amplification stage is configured to generate a mirror signal in the at least one amplifying transistor to cause the at least one amplifying transistor to rapidly heat closer to a steady state operating temperature.

13. The power amplifier of claim 8 wherein each bias circuitry further includes standard bias circuitry configured to generate a standard bias signal, the combiner combining the high amplitude pulse bias signal, the smoothing bias signal, and the standard bias signal to generate the combined bias signal.

14. The power amplifier of claim 13 wherein each standard bias circuitry includes time delay circuitry to delay ramping up of the standard bias signal, the delay based at least in part on when the high amplitude pulse signal decays.

15. A biasing system comprising:
prebias circuitry including preheat bias circuitry configured to provide a high amplitude pulse bias signal in response to an indication that a radio frequency (RF) signal to be amplified by a multi-stage power amplifier is imminent, and smoothing bias circuitry configured to provide a smoothing bias signal in response to an indication of decay of the high amplitude pulse bias signal, an amplitude and duration of the high amplitude pulse bias signal based at least in part on a first control signal, a peak amplitude and decay rate of the smoothing bias signal based at least in part on a second control signal;
a combiner configured to combine the high amplitude pulse bias signal and the smoothing bias signal to provide a combined bias signal; and
a bias input port of an amplifying stage of the multi-stage power amplifier configured to amplify the RF signal, the bias input port receiving the combined bias signal which causes at least one of a gain response of the amplifying stage to approach a steady-state gain response and a phase response of the amplifying stage to approach a steady-state phase response.

16. The biasing system of claim 15 further comprising standard bias circuitry configured to generate a standard bias signal, the combiner combining the high amplitude pulse bias signal, the smoothing bias signal, and the standard bias signal to generate the combined bias signal.

17. The biasing system of claim 16 wherein the preheat bias circuitry includes a timing control connection to the standard bias circuitry, the preheat bias control circuitry sending a control signal to the standard circuitry over the timing control connection when the high amplitude pulse signal begins to decay.

18. The biasing system of claim 15 wherein the amplifying stage includes at least one biasing transistor in a current mirror configuration with at least one amplifying transistor, the at least one biasing transistor coupled to the bias input port and configured to receive the combined bias signal which, when received, causes a mirroring signal in the at least one amplifying transistor, the mirroring signal causing the at least one amplifying transistor to rapidly heat closer to a steady state operating temperature.

19. The biasing system of claim 15 wherein the smoothing bias signal is generated and output to the bias input port prior to receipt of the RF signal.

20. The biasing system of claim 19 wherein the smoothing bias signal decays to approximately zero as an amplitude of the standard bias signal ramps up to a steady-state bias level.

\* \* \* \* \*